United States Patent [19]

Chaw

[11] Patent Number: 5,831,447
[45] Date of Patent: Nov. 3, 1998

[54] OUTPUT BUFFER WITH NOISY/QUIET VOLTAGE SOURCES AND FEEDBACK PATCH FOR NOISE REDUCTION

[75] Inventor: Steve Chaw, Hsin Ying, Taiwan

[73] Assignee: United Microelectronics Corp., Hsinchu, Taiwan

[21] Appl. No.: 789,623

[22] Filed: Jan. 27, 1997

[30] Foreign Application Priority Data

Nov. 19, 1996 [TW] Taiwan ................................. 85114217

[51] Int. Cl.$^6$ .......................... H03K 17/16; H03K 19/094
[52] U.S. Cl. ................................... 326/27; 326/87; 326/57
[58] Field of Search .................................. 326/26, 27, 57, 326/58, 83, 87, 86

[56] References Cited

U.S. PATENT DOCUMENTS

| | | | |
|---|---|---|---|
| 5,121,013 | 6/1992 | Chuang et al. ............................ | 326/26 |
| 5,204,554 | 4/1993 | Ohannes et al. ........................... | 326/86 |
| 5,319,260 | 6/1994 | Wanlass ................................... | 326/26 |
| 5,332,932 | 7/1994 | Ranaldue .................................. | 326/33 |
| 5,438,277 | 8/1995 | Sharpe-Geisler .......................... | 326/27 |
| 5,534,791 | 7/1996 | Mattos et al. ............................. | 326/58 |

*Primary Examiner*—Jon Santamauro
*Assistant Examiner*—Don Phu Le
*Attorney, Agent, or Firm*—Rabin & Champagne, P.C.

[57] ABSTRACT

An output buffer array to a data output device in an integrated circuit. The output buffer array includes a plurality of output buffers connected together to a pair of parallel connected first and second voltage lines connected to a voltage supply circuit supplying a first voltage representative of a first logic state, and also to a pair of parallel connected first and second grounding lines connected to a grounding circuit supplying a second voltage representative of a second logic state. Each output buffer further includes logic and switching means which are devised in such a manner as to allow the noise occurred in one voltage or grounding line during the switching of the input data from one logic value to another to be dumped into another line such that the voltage transferred to the output of the output buffer is free from noise. This also allows the effect of ground bounce to be significantly reduced. These benefits allow the output buffer array to operate stably and reliably to offer the desired performance.

19 Claims, 11 Drawing Sheets

OUTPUT BUFFER WITH NOISY/QUIET VOLTAGE SOURCES AND FEEDBACK PATCH FOR NOISE REDUCTION

BACKGROUND OF THE INVENTION

1. Field of the Invention

This invention relates in general to output buffers, and more particularly, to an output buffer array which is coupled to the output of data output devices to serve as a temporary data storage area or an interface to other circuitry.

2. Description of Related Art

In integrated circuit (IC) devices, the output ports thereof are usually coupled with output buffers so as to enhance the driving capability of the output signals. These output buffers also serve as an interface for communication with external circuitry. With ICs processing data at higher speeds, output buffers with high data transmission rates are demanded.

Presently, the data transmission rate of an output buffer can be enhanced by increasing the size of the pull-up and pull-down transistors in the output buffer so as to increase the switching speed of the same. This approach, however, has the drawback of producing large amounts of noise on the voltage and grounding lines connected to the pull-up and pull-down transistors. Even worse, the noise on the grounding line can be transformed to produce the so-called "ground bounce" effect on the output signal, which further degrades the performance of the output buffer array. These drawbacks will be described in more detail in the following with reference to FIGS. 1A, 1B, 2, and 3.

FIG. 1A is a schematic block diagram of a conventional output buffer array in an IC chip. This output buffer array is a one-dimensional array of n output buffers 1a, 1b, 1c, . . . , 1n which are connected via a common voltage line 2a to a voltage supply circuit and via a common grounding line 3a to a grounding circuit 3. The voltage supply circuit 2 includes a voltage source $V_{CC}$ and a pair of inductors L1, L2 (which are the equivalent circuitry of the bonding wires in the voltage supply circuit); and the grounding circuit 3 includes a ground voltage $V_{SS}$ and a pair of inductors L3, L4 (which are the equivalent circuitry of the bonding wires in the grounding circuit).

The output buffers 1a, 1b, 1c, . . . , 1n each have an input port, respectively designated by DIN1, DIN2, DIN3, . . . , and DINn, which are connected to the output ports of a data output device, such as the sense amplifiers of a memory unit. Further, the output buffers 1a, 1b, 1c, . . . , 1n are connected to a common enable signal line OE, which is connected to a CPU (central processing unit), for control by the CPU. When the CPU issues an enable signal to the output buffer array, the output buffers 1a, 1b, 1c, . . . , 1n will be enabled to receive the data from the sense amplifiers of the memory unit and then put them on the output ports OUT1, OUT2, OUT3, . . . , and OUTn.

Referring further to FIG. 2, there is shown a detail circuit diagram of the output buffer 1a shown in FIG. 1A. Other output buffers 1b, 1c, . . . , 1n have the same circuit structure. As shown, each output buffer includes a pull-up control gate 21, a pull-up device 23 coupled to the pull-up control gate 21, a pull-down control gate 25, and a pull-down device 27. The pull-up control gate 21 is composed of a two-input NAND gate 21a and a serially connected inverter 21b; and the pull-down control gate 25 is composed of a two-input NOR gate 25a and an inverter 25b coupled to one input of the NOR gate.

When the CPU (not shown) issues an enable signal control on the enable signal line OE to the output buffer 1a to request the output buffer 1a to receive the data dina on the DIN1 data line, the data dina is received concurrently by the pull-up control gate 21 and the pull-down control gate 25. In the pull-up control gate 21, the enable signal control enables the NAND gate 21a such that the data dina on the DIN1 line is transferred via the NAND gate 21a and subsequently inverted by the inverter 21b. The output of the inverter 21b is coupled to the gate G23 of the pull-up device 23. Concurrently, in the pull-down control gate 25, the enable signal control is inverted by the inverter verter 25b, allowing the inverted data $\overline{\text{dina}}$ to be received by the gate G27 of the noise pull-down device 27.

If dina=1, the pull-up device 23 will be switched on, thereby allowing the OUT1 port to generate the voltage $V_{CC}$ that is on the voltage line 2a, which represents a binary signal of 1. At this time, since dina=0, the pull-down device 27 is switched off.

When dina is switched from 1 to 0, the pull-up device 23 is switched off, while the pull-down device 27 is switched on. This allows the potential of the OUT1 port to be equal to the voltage $V_{SS}$ that is on the grounding line 3a, which represents a binary signal of 0. When dina is switched next from 0 to 1, the pull-down device 27 is switched off, while the pull-up device 23 is switched on, allowing the OUT1 port to be connected again to the voltage line 2a and thereby to generate $V_{CC}$ which represents a binary signal of 1.

One drawback to the foregoing output buffer, however, is that, the equivalent inductors L1, L2 in the voltage supply circuit 2 and the equivalent inductors L3, L4 in the grounding circuit 3 have the effect of opposing the change in the current flowing through the voltage supply circuit 2 and the grounding circuit 3 when the pull-up device 23 or the pull-down device 27 is switched on or off. As a consequence of this, noise will be introduced into the output data.

The grounding line 3a is particularly vulnerable to the adverse effect of ground bounce. In FIG. 1B, for example, the circuit of FIG. 1A is reconnected in such a manner as to connect the input port DINn of the last output buffer In to the grounding line 3a and tie the input ports DIN1–DINn−1 of all the other output buffers 1a–1n−1 together. The waveforms of the control signals and data in the circuit of FIG. 1B are illustrated in FIG. 3. When the output port OUTn of the last output buffer In is connected to the grounding line 3a so as to output a binary signal of 0, the other output buffers output buffers 1a, 1b, . . . , 1n−1 receive the data dina via the input ports DIN1, DIN2, DINn−1 so that the output ports OUT1, OUT2, . . . , OUTn−1 output a binary signal corresponding to the input data dina.

When the enable signal control is put on the signal line OE, the data dina is accepted by the output buffer array. The output buffers 1a, 1b, . . . , 1n−1 will generate binary signals 1 or 0 at the output ports OUT1, OUT2, . . . , OUTn−1 in response to the data dina.

At this same time, $V_{CC}$ noise and $V_{SS}$ noise will be introduced onto the voltage line 2a and grounding line 3a, respectively. As to the last output buffer In, since the input port DINn thereof is connected to the grounding line 3a, the output port OUTn thereof is maintained at a logic-0 output. When the output ports OUT1, OUT2, . . . , OUTn−1 of the output buffers 1a, 1b, . . . , 1n−1 are switched from 1 to 0 due to connection to the $V_{SS}$, the noise on the grounding line 3a due to the inductors L3, L4 will influence the output on the output port OUTn of the output buffer 1n, thus causing the generation of ground bounce, as illustrated in FIG. 3. As a consequence of this, the output data of the output buffer array thus can be unreliable. The performance of the IC device is affected.

SUMMARY OF THE INVENTION

It is therefore a primary objective of the present invention to provide an output buffer array in which the adverse effect of noise bounce is averted so that the output buffer array can operate stably and reliably to offer the desired performance.

In accordance with the foregoing and other objectives of the present invention, a new output buffer array and an output buffer which is used to construct the output buffer array are provided.

Broadly speaking, the output buffer array includes:

(a) a plurality of output buffers having an input port for receiving input data and an output port for sending out the buffered data;

(b) a voltage circuit for supplying a voltage representative of one logic state;

(c) a pair of parallel connected voltage lines including a first voltage line and a second voltage line, each having a first end connected to the voltage circuit and a second end connected to the plurality of output buffers;

(d) a grounding circuit for supplying a grounding voltage;

(e) a pair of parallel connected grounding lines including a first grounding line and a second grounding line, each having a first end connected to the grounding circuit and a second end connected to the plurality of output buffers; and (f) logic means coupled to the output buffer array and the voltage and grounding lines.

The logic means is capable of converting the output of the output buffer array into a series of feedback signals of predetermined time delays, such that when the input data switches from logic-0 state to logic-1 state, the noise from the voltage circuit is dumped onto the second voltage line and meanwhile the voltage on the first voltage line is transferred to the output of the output buffer array. On the other hand, when the input data switches from logic-1 state to logic-0 state, the noise from the grounding circuit is dumped onto the second grounding line and meanwhile the grounding voltage on the first grounding line is transferred to the output of the output buffer array.

Broadly speaking, each output buffer includes:

(a) a voltage circuit for supplying a voltage representative of one logic state;

(b) a pair of parallel connected voltage lines including a first voltage line and a second voltage line connected to the voltage circuit;

(c) a grounding circuit for supplying a grounding voltage;

(d) a pair of parallel connected grounding lines including a first grounding line and a second grounding line connected to the grounding circuit;

(e) a pair of control gates including a pull-up control gate and a pull-down control gate which receives input data;

(f) first and second switching means under control of the pull-up control gate and coupled respectively to the first and second voltage lines;

(g) third and fourth switching means under control of the pull-down control gate and coupled respectively to the first and second grounding lines; and (h) feedback/delay means, coupled between the output of the output buffer and the pull-up control gate and the pull-down control gate, for generating a series of feedback signals of predetermined time delays which cause the pull-up control gate and the pull-down control gate to control the switching of the first, second, third, and fourth switching means.

When the second switching means is switched on by the pull-up control gate, the voltage on the second voltage line is transferred to the output of the output buffer serving as a first output signal; and when the first switching means is switched on by the pull-up control gate, the voltage on the first voltage line is transferred to the output of the output buffer serving as a second output signal.

On the other hand, when the fourth switching means is switched on by the pull-down control gate, the grounding voltage on the second grounding line is transferred to the output of the output buffer serving as a third output signal; and when the third switching means is switched on by the pull-down control gate, the grounding voltage on the first grounding line is transferred to the output of the output buffer serving as a fourth output signal.

When the input data switches from logic-0 state to logic-1 state, the pull-down control gate receives the input data to thereby first switch off the third switching means and then switch on the second switching means such that the noise from the voltage circuit is dumped into the second voltage line. Subsequently, the pull-up control gate receives the feedback signals to thereby switch on the first switching means to send out the second output signal and then switch off the second switching means after a first time delay.

On the other hand, when the input data switches from logic-1 state to logic-0 state, the pull-up control gate receives the input data to thereby first switch off the first switching means and then switch on the fourth switching means such that the noise from the grounding circuit is dumped onto the second grounding line. Subsequently, the pull-down control gate receives the feedback signals to thereby switch on the third switching means to send out the fourth output signal and then switch off the fourth switching means after a second time delay.

By the invention, the noise on the voltage or grounding lines during the switching of the input data from one logic value to another can be significantly reduced. Furthermore, the effect of ground bounce can also be significantly reduced. These benefits allow the output buffer array to operate stably and reliably to offer the desired performance.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1A:
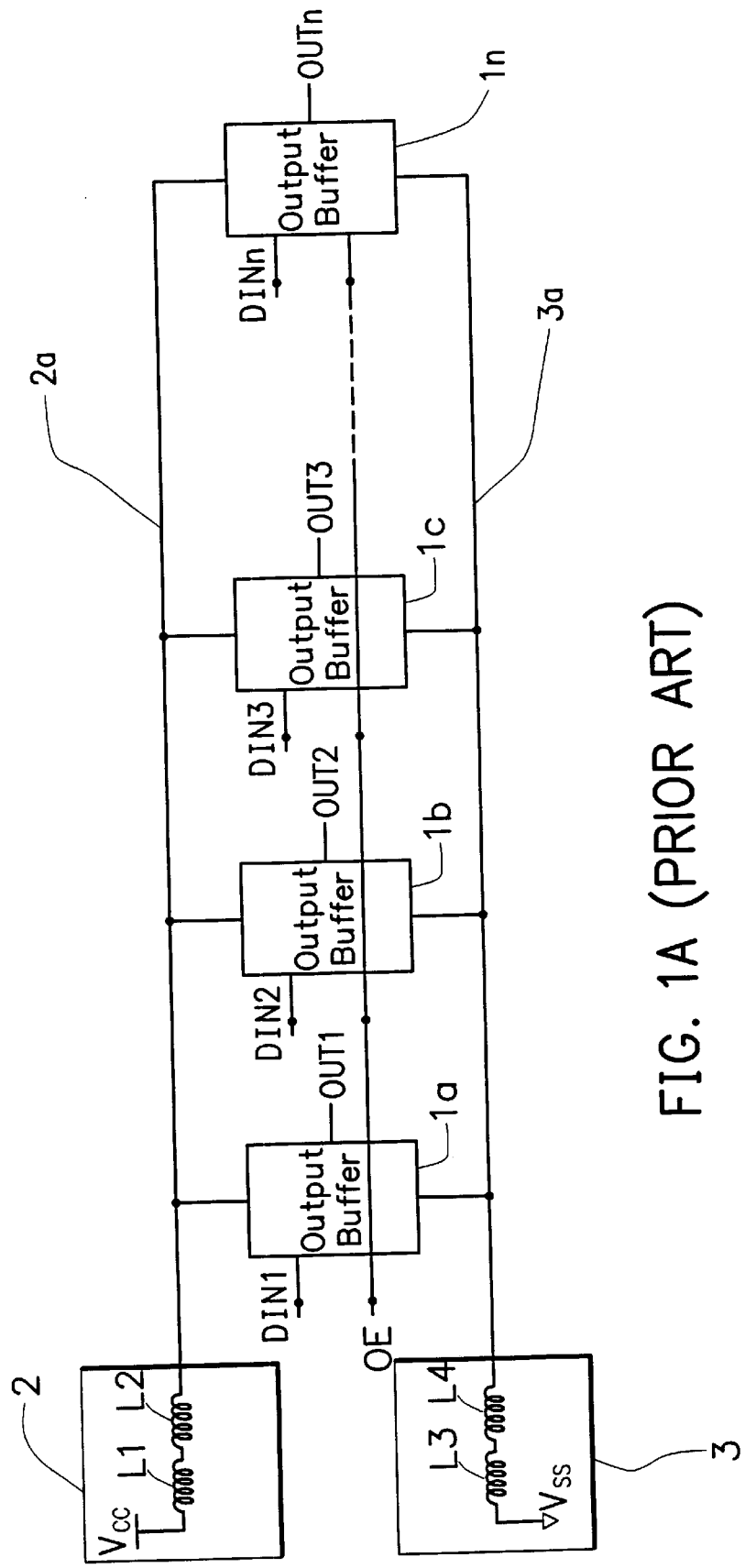
FIG. 1A is a schematic block diagram of a conventional one-dimensional array of output buffers.
Figure 1B:
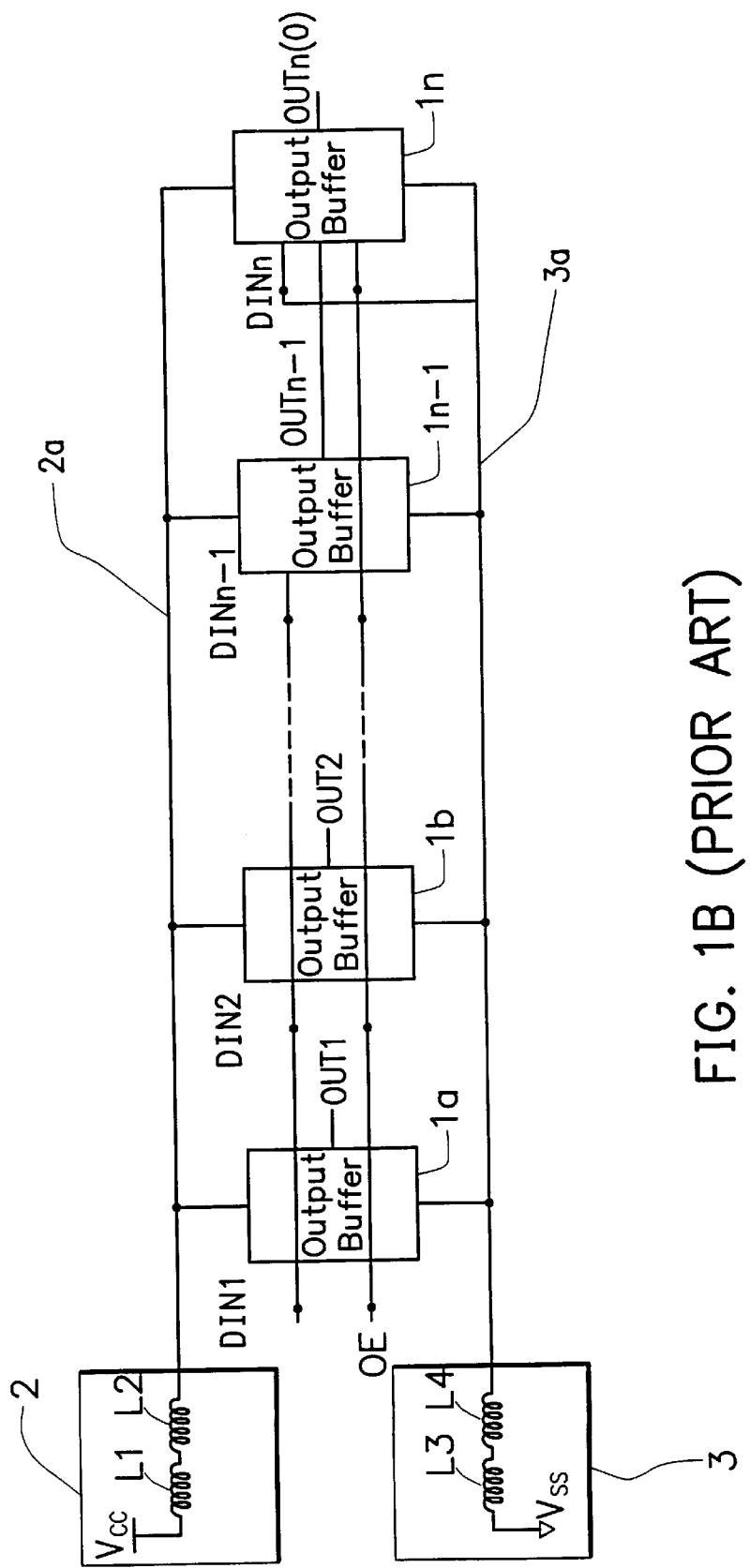
FIG. 1B shows the output buffer array of FIG. 1A wired in a different manner.
Figure 2:
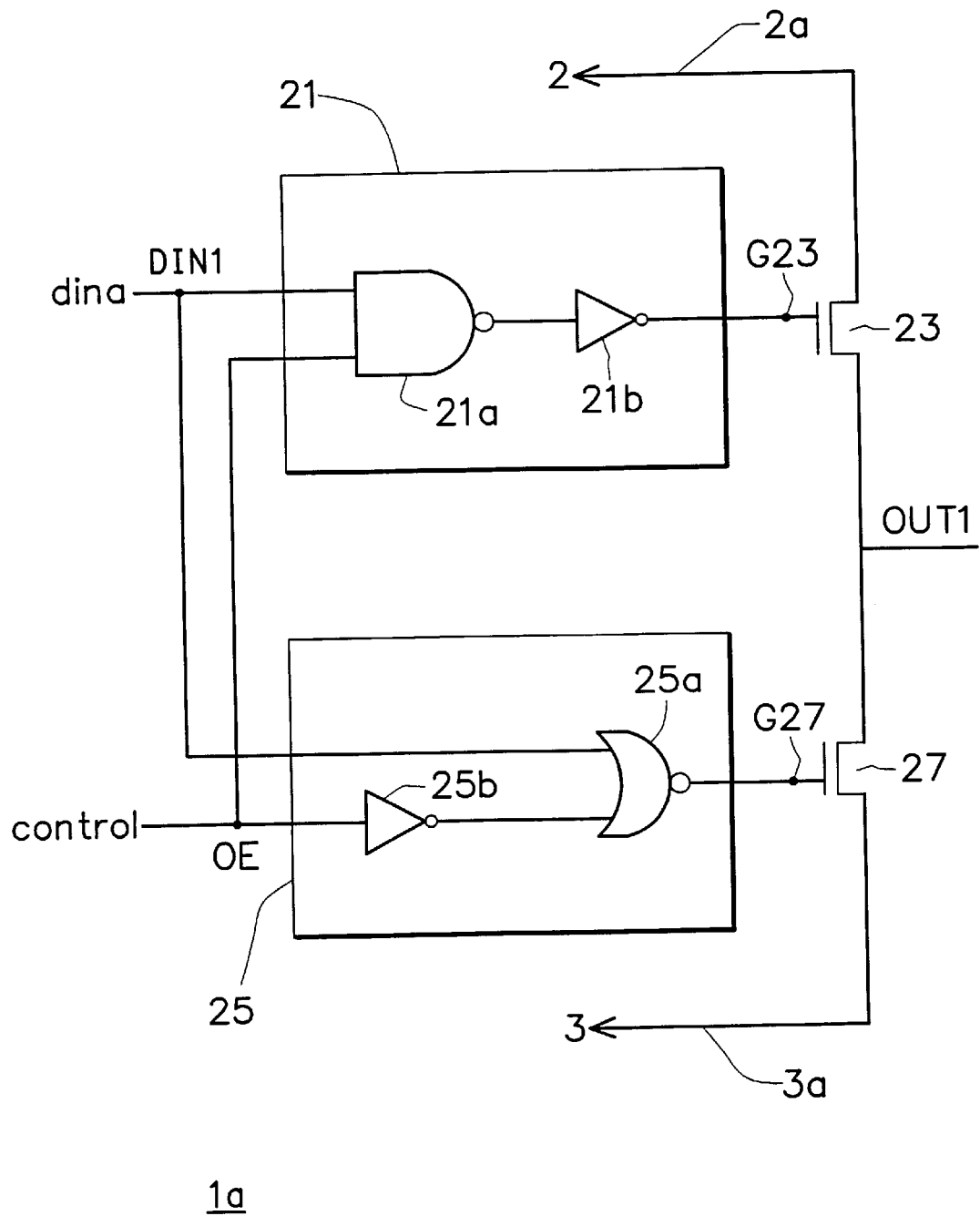
FIG. 2 is a detailed circuit diagram of an individual output buffer in the output buffer array of FIGS. 1A and 1B.
Figure 3:
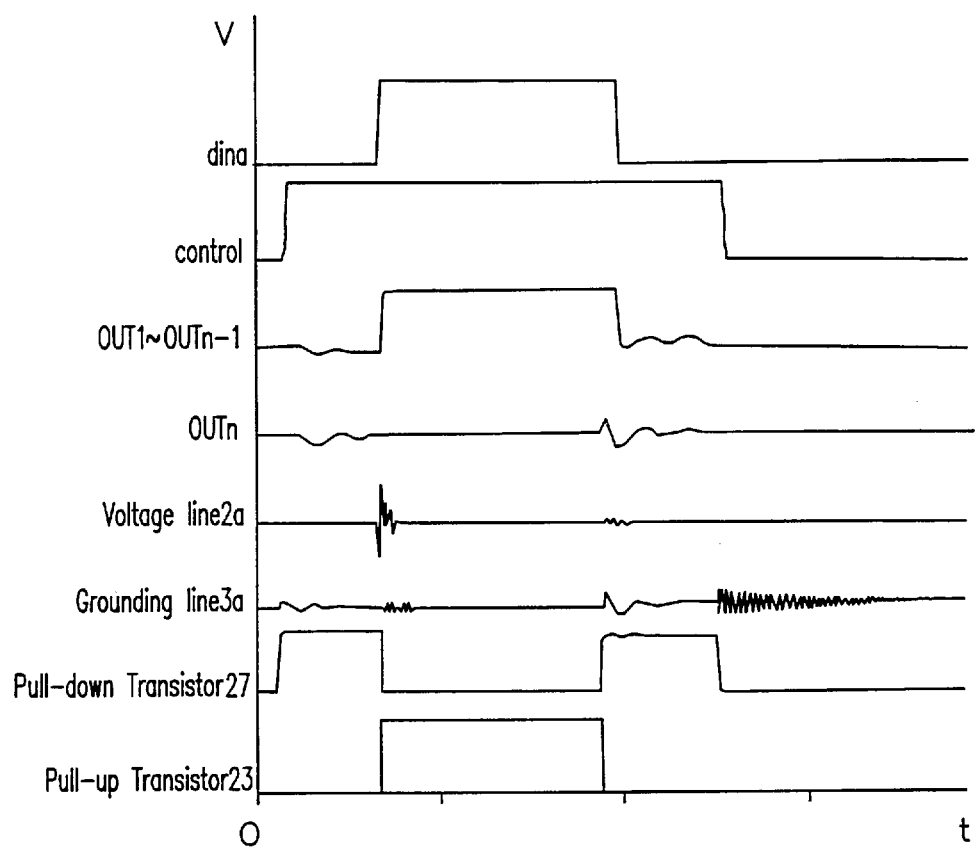
FIG. 3 are waveform diagrams of several signals in the output buffer array of FIG. 1B.
Figure 4A:
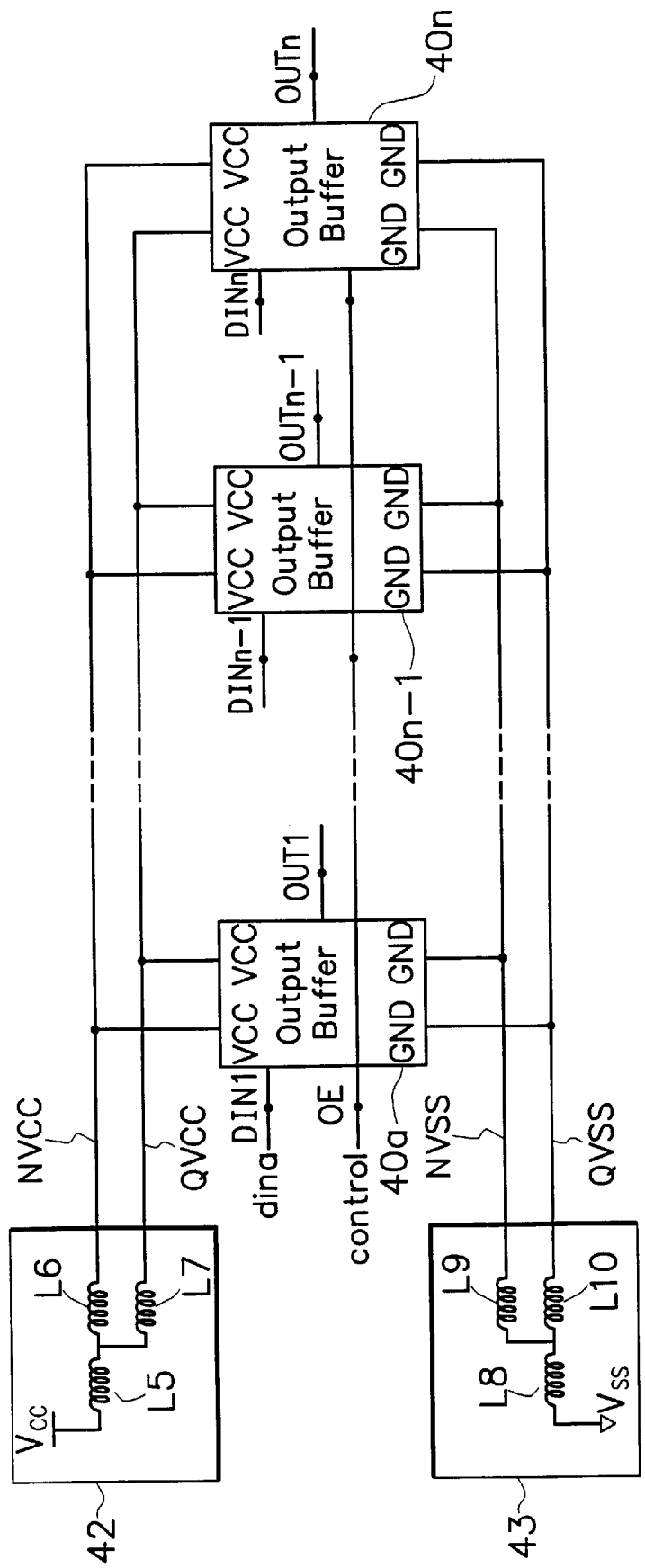
FIG. 4A is a schematic block diagram of the output buffer array according to the present invention.

Referring to FIG. 4A, the output buffer array according to the present invention includes a one-dimensional array of n output buffers 40a–40n. These output buffers 40a–40n are connected via a pair of parallel connected common voltage lines including an NVCC (which stands for noise $V_{CC}$ line) voltage line and a QVCC (which stands for quiet $V_{CC}$ line) voltage line to a voltage supply circuit 42, and likewise via a pair of parallel connected grounding lines including an NVSS (which stands for noise $V_{SS}$ line) grounding line and a QVSS (which stands for quiet $V_{CC}$ line) grounding line to a grounding circuit 43. The voltage supply circuit 42 includes a voltage source $V_{CC}$ and three inductors L5, L6, L7 (which are the equivalent circuitry of the bonding wires in the voltage supply circuit); and the grounding circuit 43 includes a ground voltage $V_{SS}$ and three inductors L8, L9, L10 (which are also the equivalent circuitry of the bonding wires in the grounding circuit).

The output buffers 40a–40n each have an input port, respectively designated by DIN1 through DINn, which are connected to the output ports of a data output device, such as the sense amplifiers of a memory unit (not shown). Further, the output buffers 40a–40n are connected to a common enable signal line OE, which is connected to a CPU (central processing unit), for control by the CPU. When the CPU issues an enable signal control via the signal line OE to the output buffer array, the output buffers 40a–40n are enabled to receive the data, designated by dina, from the sense amplifiers of the memory unit (not shown) and then put them on the output ports OUT1, OUT2, OUT3, . . . , and OUTn.

Figure 5:
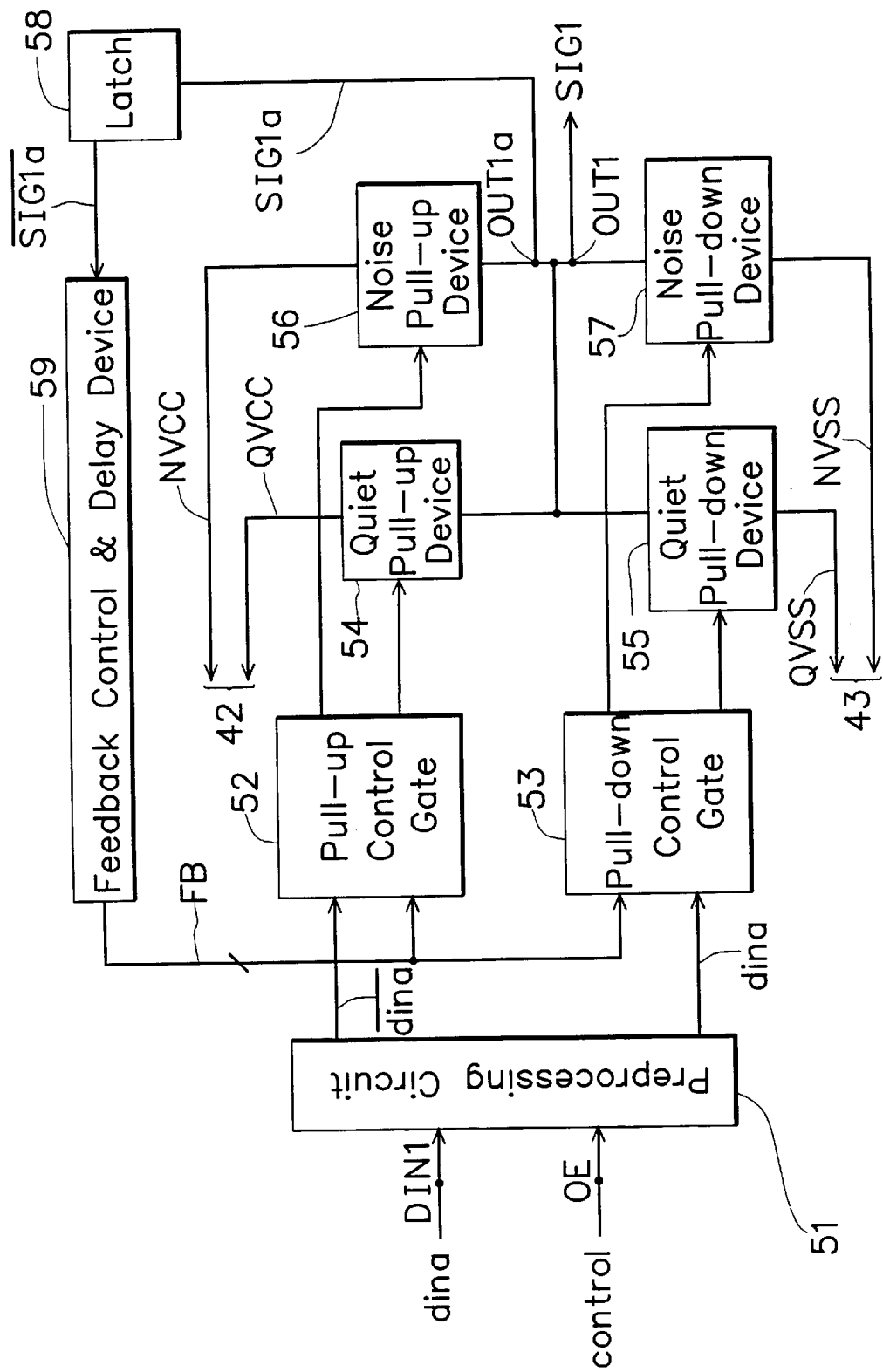
FIG. 5 is a schematic block diagram of an individual output buffer in the output buffer array of FIGS. 4A and 4B.

Referring further to FIG. 5, there is shown a detail circuit diagram of each of the output buffers 40a–40n. As shown, each output buffer includes a preprocessing circuit 51, a pull-up control gate 52, a pull-down control gate 53, a quiet pull-up device 54, a quiet pull-down device 55, a noise pull-up device 56, a noise pull-down device 57, a latch 58, and a feedback control & delay device (hereinafter abbreviated as FC/D device) 59.

The preprocessing circuit 51 has two input ports, respectively connected to one of the DIN1–DINn signal lines and to the enable signal line OE. The voltage lines QVCC and NVCC as depicted in FIG. 4A are respectively connected to the quiet pull-up device 54 and the noise pull-up device 56; and the grounding lines QVSS and NVSS are respectively connected to the quiet pull-down device 55 and the noise pull-down device 57.

The noise pull-up device 56 and the noise pull-down device 57 are connected to a common node OUT1a which serves as an output port to transfer an output signal SIG1a to the latch 58. The quiet pull-up device 54 and the quiet pull-down device 55 are connected to a common node OUT1 which serves an output port to transfer an output signal SIG1 to an external circuit (not shown).

When each output buffer receives the enable signal control via the signal line OE, the preprocessing circuit 51 is enabled to receive the data dina thereinto and then generates the inverted value of dina, designated by $\overline{dina}$, to the pull-up control gate 52, and the unchanged dina to the pull-down control gate 53. In this embodiment, for example, when dina=0, the pull-up control gate 52 is enabled to control the quiet pull-up device 54 and noise pull-up device 56; and when dina=1, the pull-down control gate 53 is enabled to control the quiet pull-down device 55 and noise pull-down device 57.

Figure 7A:
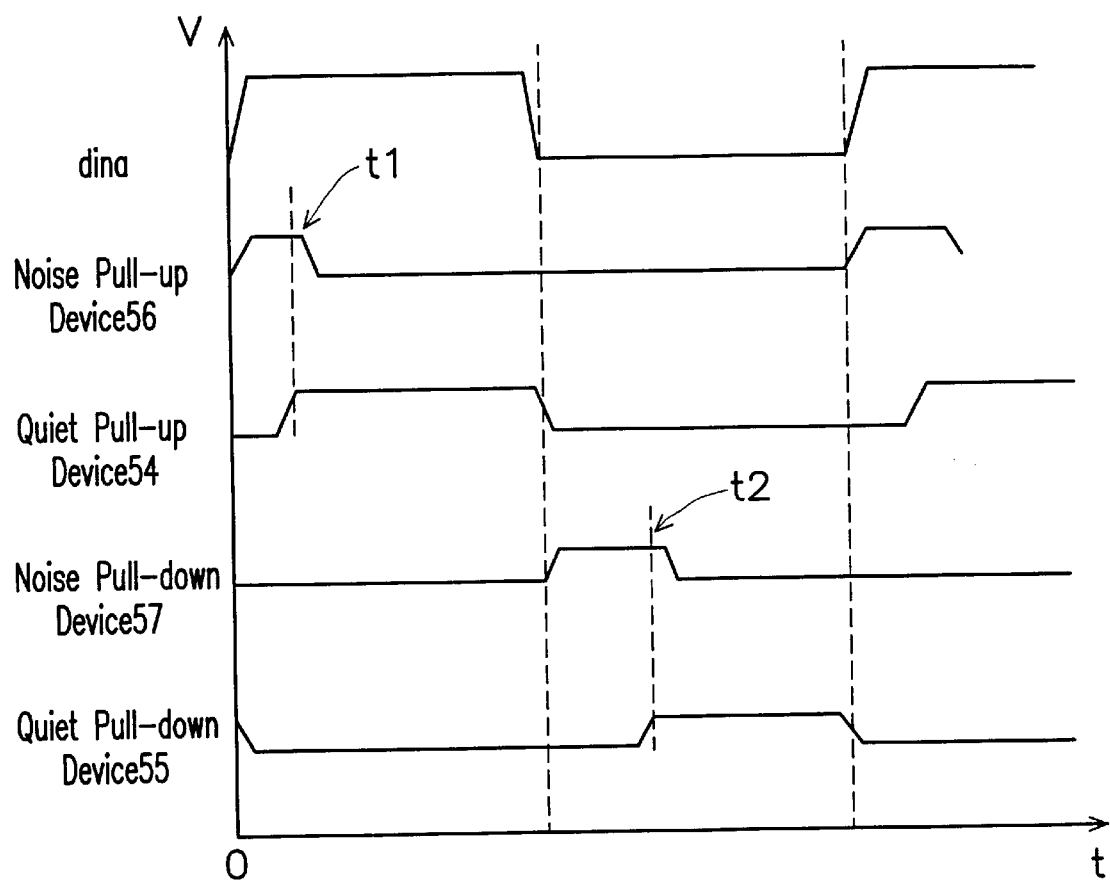
FIG. 7A shows waveform diagrams of several signals in the output buffer of FIG. 5.

Referring to FIG. 7A together with FIG. 5, assume the output buffer of FIG. 5 is initially set in such a condition that OUT1a=OUT1=0 when dina=0. When dina is switched from 0 to 1, the quiet pull-up device 54, the noise pull-up device 56, and the noise pull-down device 57 are all switched off, while the quiet pull-down device 55 is being switched off. At this time, the input $\overline{dina}$=0 to the pull-up control gate 52 causes the same to switch on the noise pull-up device 56, allowing the $V_{CC}$ voltage on the NVCC voltage line to be transferred via the noise pull-up device 56 to the node OUT1a, whereby the output signal SIG1a from the node OUT1a is switched from 0 to 1. The latch 58 then inverts the signal SIG1a into $\overline{SIG1a}$ ($\overline{SIG1a}$=0 at this time) and transfers $\overline{SIG1a}$ to the FC/D device 59. The FC/D device 59 then produces a number of time delays of the $\overline{SIG1a}$ signal and feeds these signals, designated collectively as FB, back to the pull-up control gate 52. In response to the FB signal, the pull-up control gate 52 will promptly switch on the quiet pull-up device 54, and then, after a time delay of $t_1$, switch off the noise pull-up device 56. After being switched on, the quiet pull-up device 54 will output a logic-1 signal, thus causing SIG1=1 at the node OUT1.

On the other hand, when dina is switched from 1 to 0, the quiet pull-down device 55, the noise pull-down device 57, and the noise pull-up device 56 are switched off, while the quiet pull-up device 54 is being switched off. At this time, the input dina=0 to the pull-down control gate 53 causes the same to switch on the noise pull-down device 57, thereby allowing the $V_{SS}$ voltage on the NVSS grounding line to be transferred via the noise pull-down device 57 to the node OUT1a. This causes the output signal SIG1a from the node OUT1a to be switched from 1 to 0. The latch 58 then inverts the signal SIG1a into $\overline{SIG1a}$ ($\overline{SIG1a}$=1 at this time) and transfers $\overline{SIG1a}$ to the FC/D device 59. The FC/D device 59 then produces a number of time delays of the $\overline{SIG1a}$ signal and feeds these signals, designated collectively as FB, back to the pull-down control gate 53. In response to the FB signal, the pull-down control gate 53 will promptly switch on the quiet pull-down device 55, and then, after a time delay of $t_2$, switch off the noise pull-down device 57. After being switched on, the quiet pull-down device 55 will output a logic-0 signal, thus causing SIG1=0 at the node OUT1.

Due to the fact that, during the switching of dina from one binary value to another, only the noise pull-up device 56 or the noise pull-down device 57 is switched on, the noise produced during that period is mostly dumped onto the NVCC voltage line connected to the noise pull-up device 56 or the NVSS grounding line connected to the noise pull-down device 57 owing to the equivalent inductors L5, L6, L7 in the voltage supply circuit 42 and the equivalent inductors L8, L9, L10 in the grounding circuit 43 opposing the changes of currents. This significantly reduces the noise levels in the QVCC voltage line connected to the quiet pull-up device 54 and the QVSS grounding line connected to the quiet pull-down device 55.

The input of the latch 58 is connected to the node OUT1a and is used to invert the output signal SIG1a to $\overline{SIG1a}$ and then transfer $\overline{SIG1a}$ to the FC/D device 59. In the case of the output buffer being in a floating tristate, the latch 58 should be able to latch the previous state of SIG1a so as to maintain normal operation of the output buffer. Otherwise, the latch 58 can be simply an inverter.

Figure 4B:
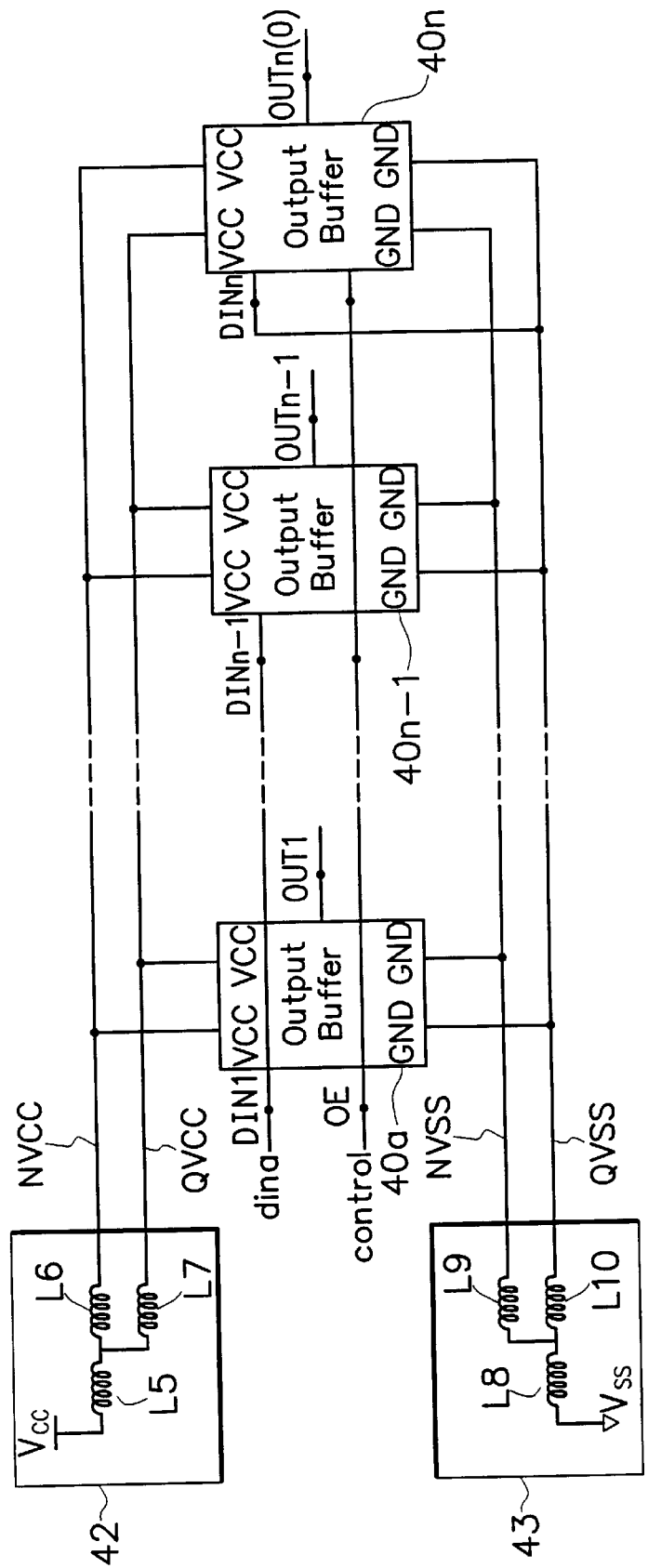
FIG. 4B shows the output buffer array of FIG. 4A wired in a different manner.
Figure 7B:
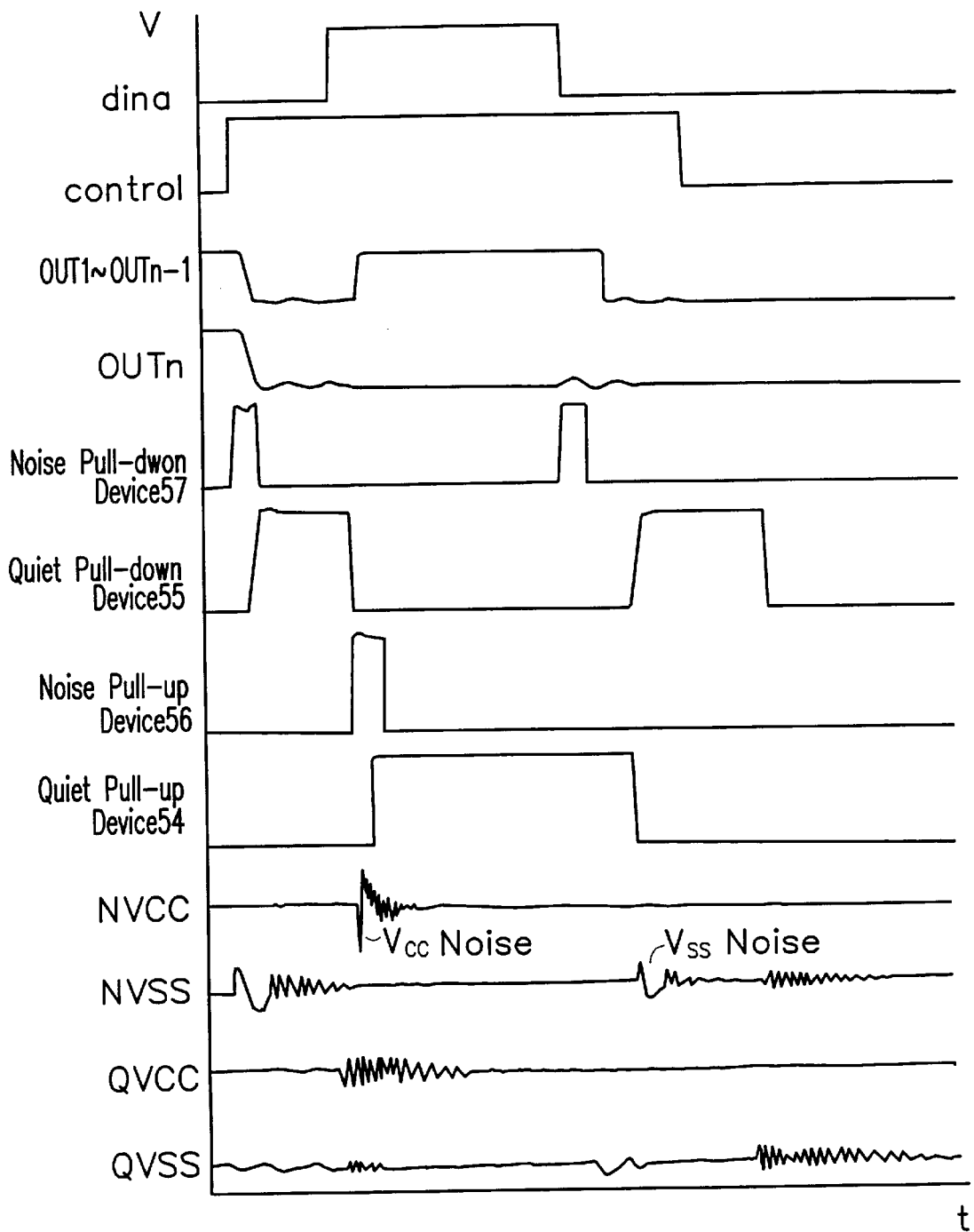
FIG. 7B shows waveform diagrams of several signals in the output buffer array of FIG. 4B.

In FIG. 4B, for example, the circuit of FIG. 4A is reconnected in such a manner as to connect the input port DINn of the last output buffer 40n to the QVSS grounding line and the input ports DIN1–DINn–1 of all the other output buffers 40a–40n–1 to the input data dina. This allows the output port OUTn of the last output buffer 40a to be maintained at a logic-0 state. FIG. 7B shows the waveform diagrams of various signals in the circuit of FIG. 4B.

When the data dina appears on the data line, the enable signal control also appears on the signal line OE. This allows each of the output buffers 40a–40n–1 to generate a logic state equal to the binary value of dina. As described above, during the switching of the output state from one value to another, the noise in the output buffers 40a–40n–1 will be mostly dumped onto the NVCC voltage line connected to the noise pull-up device 56 in each output buffer and also onto the NVSS grounding line connected to the noise pull-down device 57 in each output buffer. This significantly reduces the noise levels in the QVCC voltage line connected to the quiet pull-up device 54 and the QVSS grounding line connected to the quiet pull-down device 55 in each of the output buffers 40a–40n–1. As a result of this, the effect of ground bounce in the last output buffer 40n can be significantly reduced to a negligible level, allowing the output port OUTn to be maintained at a logic-0 output state.

Figure 6A:
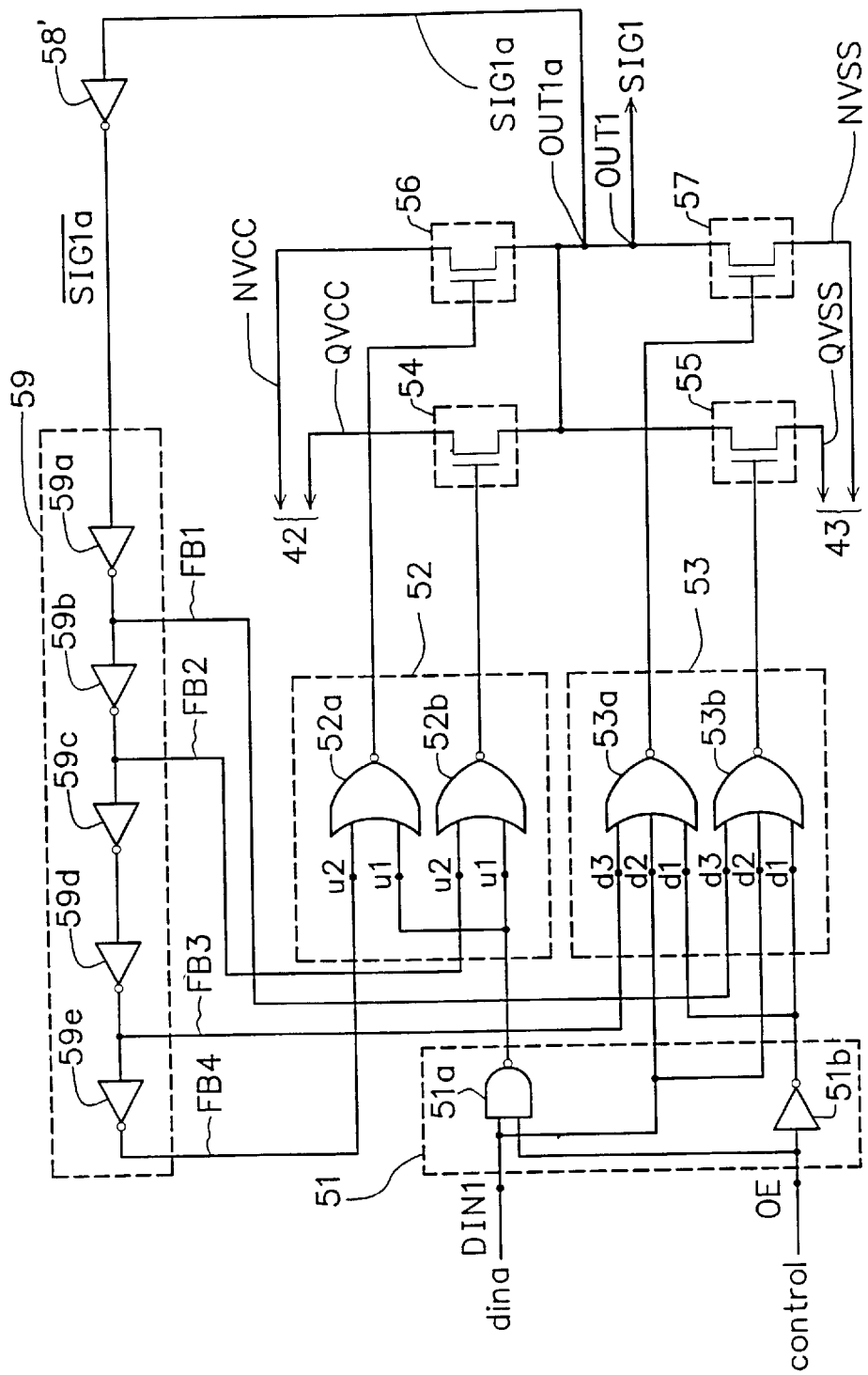
FIG. 6A is a circuit diagram of the first embodiment of the output buffer of FIG. 5.

FIG. 6A shows a detailed circuit diagram of the output buffer of FIG. 5. As shown, the FC/D device 59 is composed of a plurality of cascaded inverters (in this embodiment, five inverters 59a, 59b, 59c, 59d, 59e). The input of the first inverter 59a is coupled to the output $\overline{SIG1a}$ of the inverter 58' (which is the above-mentioned latch 58). The FC/D device 59 here has four outputs FB1, FB2, FB3 and FB4, which are respectively the output of the first inverter 59a, the output of the second inverter 59b, the output of the fourth inverter 59d, and the output of the last inverter 59e. Each inverter in the FC/D device 59 represents a time delay of a specific duration.

The logic states of the feedback signals FB1, FB2, FB3 and FB4 are related to the signal SIG1a (or $\overline{SIG1a}$) as shown in the following table.

connected to the input port DIN1 to receive dina. The d3 port of the first NOR gate 53a is connected to the output FB3 of the fourth inverter 59d in the FC/D device 59, while the d3 port of the second NOR gate 53b is connected to the output FB1 of the first inverter 59a in the same.

By means of the foregoing logic circuit and the binary states of the signals SIG1a, $\overline{SIG1a}$, FB1, FB2, FB3, and FB4, the waveforms of FIG. 7A can be obtained to respectively control the switching on and off of the noise pull-up device 56, the quiet pull-up device 54, the noise pull-down device 57, and the quiet pull-down device 55.

The quiet pull-up device 54, the noise pull-up device 56, the quiet pull-down device 55, and the noise pull-down device 57 are each a MOS (metal-oxide semiconductor) transistor of n-type, for example. The MOS transistor serving as the quiet pull-up device 54 has a gate connected to the output of the second NOR gate 52b in the pull-up control gate 52, while the MOS transistor serving as the noise pull-up device 56 is connected to the output of the first NOR gate 52a in the same pull-up control gate 52. Similarly, the MOS transistor serving as the quiet pull-down device 55 has a gate connected to the output of the second NOR gate 53b in the pull-down control gate 53, while the MOS transistor serving as the noise pull-down device 57 has a gate connected to the output of the first NOR gate 53a in the same pull-down control gate 53.

Figure 6B:
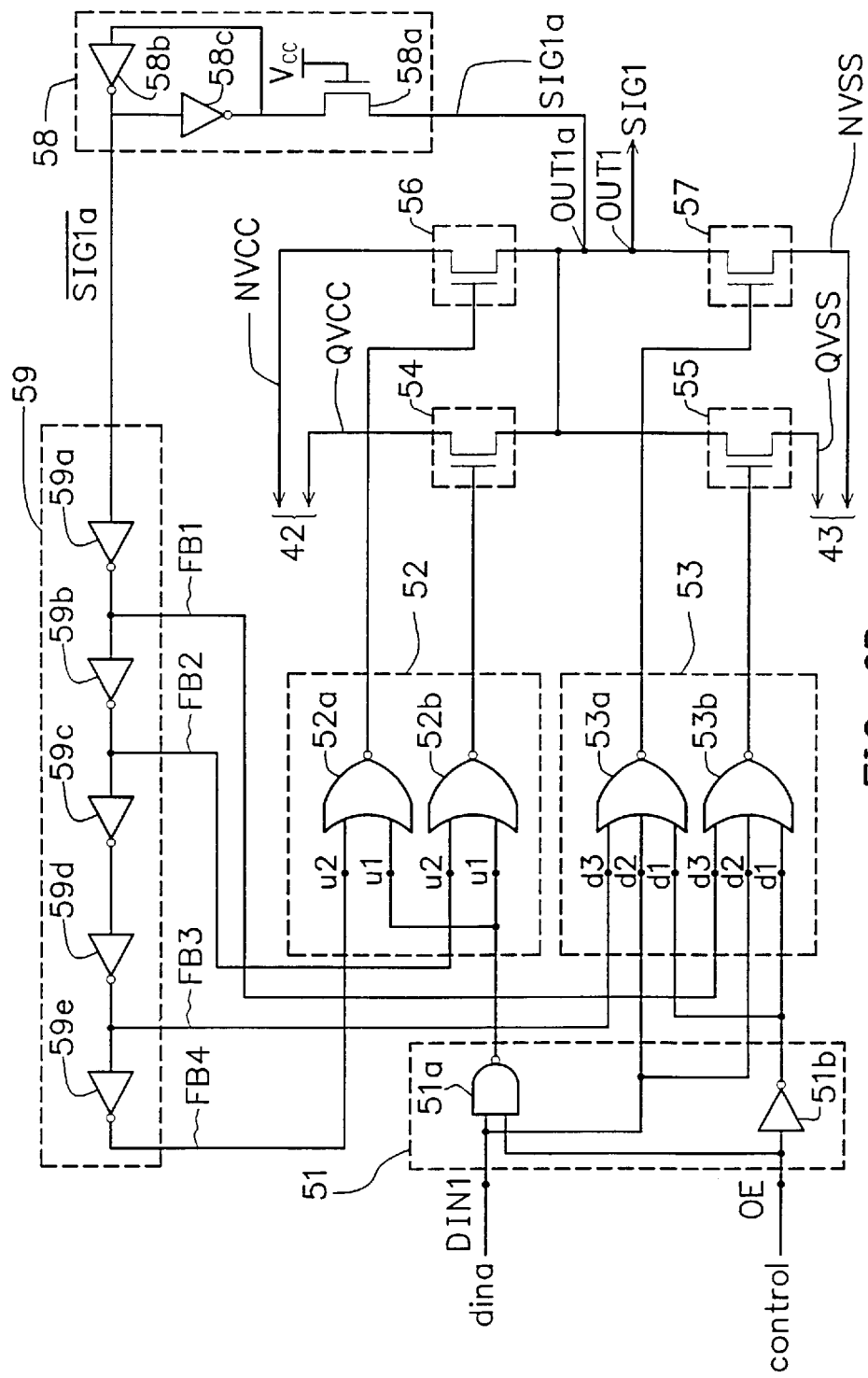
FIG. 6B is a circuit diagram of the second embodiment of the output buffer of FIG. 5.

The latch 58 can be implemented by two different circuits. The one shown in FIG. 6A is implemented by an inverter 58' which inverts the signal SIG1a into $\overline{SIG1a}$ and then transfers $\overline{SIG1a}$ to the FC/D device 59. Alternatively, as shown in FIG. 6B, the latch 58 can be implemented by a circuit composed of a MOS transistor 58a and a pair of parallel connected inverters 58b, 58c in which the output of the inverter 58c is connected to the input of the inverter 58b. The MOS transistor 58a has a gate connected to $V_{CC}$ and a source connected to the OUT1a node for receiving the SIG1a signal, and a drain connected to the input of the inverter 58b and the output of the inverter 58c. The output

|  | FB1 (to 53b) | FB2 (to 52b) | FB3 (to 53a) | FB4 (to 52a) |
|---|---|---|---|---|
| SIG1a = 0 ($\overline{SIG1a}$ = 1) | 0 | 1 | 1 | 0 |
| SIG1a = 1 ($\overline{SIG1a}$ = 0) | 1 | 0 | 0 | 1 |

The preprocessing circuit 51 is composed of an NAND gate 51a and an inverter 51b. When the enable signal control appears on the signal line OE, the NAND gate 51a is enabled to transfer the inverted value of dina (i.e., $\overline{dina}$) to the pull-up control gate 52. The original data dina is directly transferred to the pull-down control gate 53. Meanwhile, the control signal is inverted by the inverter 51b into $\overline{control}$ which is sent along with dina to the pull-down control gate 53.

The pull-up control gate 52 is composed of a pair of two-input NOR gates 52a, 52b, each having two input ports u1, u2. Both u1 ports of the NOR gates 52a, 52b are connected to the output of the NAND gate 51a in the preprocessing circuit 51, while the u2 port of the first NOR gates 52a is coupled to the output FB4 of the last inverter 59e in the FC/D device 59 and the u2 port of the second NOR gate 52b is connected to the output FB2 of the second inverter 59b in the FC/D device 59.

The pull-down control gate 53 is composed of a pair of three-input NOR gates 53a, 53b, each having three input ports d1, d2, d3. Both d1 ports of the NOR gates 53a, 53b are connected to the control signal, and both d2 ports are of the inverter 58b is then the above-mentioned $\overline{SIG1a}$ which is then transferred to the FC/D device 59.

In conclusion, the output buffer array of the invention allows the noise on the QVSS grounding line to be significantly reduced by means of the NVCC and QVCC voltage lines, the NVSS and QVSS grounding lines, and the associated circuits of the quiet pull-up device 54, the noise pull-up device 56, the quiet pull-down device 55, and the noise pull-down device 57. Furthermore, the effect of ground bounce can also be significantly reduced by means of the FC/D device 59 providing a plurality of feedback signals with different time delays to control the switching of the pull-up control gate 52 and pull-down control gate 53. These benefits allow the output buffer array to operate stably and reliably to offer the desired performance.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. An output buffer which is connected to a pair of parallel connected first and second voltage lines connected to a voltage supply circuit supplying a first voltage representative of a first logic state and also to a pair of parallel connected first and second grounding lines connected to a grounding circuit supplying a second voltage representative of a second logic state, said output buffer comprising:

a preprocessing circuit which receives input data and generates a first logic output equal in value to the input data and a second logic output equal in value to the inversion of the input data;

a pull-down control gate which receives said first logic output from said preprocessing circuit;

a pull-up control gate which receives said second logic output from said preprocessing circuit;

a pair of first and second pull-up devices which are coupled to said pull-up control gate and said first and second voltage lines;

a pair of first and second pull-down devices which are coupled to said pull-down control gate and said first and second grounding lines; and feedback/delay means, in response to a first output of said output buffer, for generating a series of four feedback signals of predetermined time delays including a first feedback signal, a second feedback signal succeeding said first feedback signal, a third feedback signal succeeding said second feedback signal, and a fourth feedback signal succeeding said third feedback signal;

wherein when the input data switches from logic-0 state to logic-1 state, said pull-down control gate receives said first logic output from said preprocessing circuit to thereby switch off said first pull-down device, and said pull-up control gate receives said fourth feedback signal to thereby switch on said second pull-up device to generate said first output which is sent to said feedback/delay means to alter the values of said series of feedback signals; subsequently, said pull-up control gate receives said second feedback signal to thereby switch on said first pull-up device such that the voltage on said first voltage line is transferred to the output of said output buffer serving as a second output, and then switch off said second pull-up device in response to said fourth feedback signal after a first time delay; and wherein when the input data switches from logic-1 state to logic-0 state, said pull-up control gate receives said second logic output from said preprocessing circuit to thereby switch off said first pull-up device, and said pull-down control gate receives said third feedback signal to thereby switch on said second pull-down device to generate a third output which is sent to said feedback/delay means to alter the values of said series of feedback signals; subsequently, said pull-down control gate receives said first feedback signal to thereby switch on said first pull-down device such that the grounding voltage on said first grounding line is transferred to the output of said output buffer serving as a fourth output, and then switch off said second pull-down device in response to said third feedback signal after a second time delay.

2. The output buffer of claim 1, further comprising:
an inverter, coupled between the output of said output buffer and the input of said feedback/delay means, for inverting said first output from said second pull-up device.

3. The output buffer of claim 1, further comprising:
a latch, coupled between the output of said output buffer and the input of said feedback/delay means, for inverting said first output from said second pull-up device.

4. The output buffer of claim 3, wherein said latch includes:
a MOS transistor having a source connected to said second pull-up device; and first and second inverters wherein said second inverter has an output port connected to both the drain of said MOS transistor and the input port of said first inverter, and the output of said first inverter is transferred to said feedback/delay means.

5. The output buffer of claim 4, wherein said MOS transistor is n-type having a gate connected to a constant voltage.

6. The output buffer of claim 1, wherein said third output is obtained by inverting the output of said second pull-down device by an inverter.

7. The output buffer of claim 1, wherein said third output is obtained by inverting the output of said second pull-down device by a latch.

8. The output buffer of claim 7, wherein said latch includes:
a MOS transistor having a source connected to said second pull-down device; and first and second inverters wherein said second inverter has an output port connected to both the drain of said MOS transistor and the input port of said first inverter, and the output of said first inverter is transferred to said feedback/delay means.

9. The output buffer of claim 8, wherein said MOS transistor is n-type having a gate connected to a constant voltage.

10. The output buffer of claim 1, wherein said feedback/delay means includes a plurality of cascaded inverters which, in response to said first output and second output of said output buffer, generate said first, second, third, and fourth feedback signals.

11. The output buffer of claim 10, wherein said feedback/delay means includes a first inverter, a second inverter connected in succession to said first inverter, a third inverter connected in succession to said second inverter, a fourth inverter connected in succession to said third inverter, and a fifth inverter connected in succession to said fourth inverter; wherein said first feedback signal is the output of said first inverter, said second feedback signal is the output of said second inverter, said third feedback signal is the output of said fourth inverter, and said fourth feedback signal is the output of said fifth inverter.

12. The output buffer of claim 11, wherein said first, second, third, and fourth feedback signals are related in logic values to said first output and third output of said output buffer as follows:

|                              | First Feedback Signal | Second Feedback Signal | Third Feedback Signal | Fourth Feedback Signal |
|------------------------------|-----------------------|------------------------|-----------------------|------------------------|
| First output or third output = 0 | 0                     | 1                      | 1                     | 0                      |
| First output or third output = 1 | 1                     | 0                      | 0                     | 1                      |

13. The output buffer of claim 12, wherein said preprocessing circuit includes:

an inverter having an input port connected to receive said enable signal, said inverter generating an inverted value of said enable signal; and a NAND gate having two input ports respectively connected to receive the input data and an enable signal, said NAND gate generating an inverted value of the input data when said enable signal is a logic-1 signal.

14. The output buffer of claim 12, wherein said pull-up control gate includes:

a first NOR gate having two input ports connected respectively to receive said fifth feedback signal from said feedback/delay means and the output of said NAND gate in said preprocessing circuit; and a second NOR gate having two input ports connected respectively to receive said second feedback signal from said feedback/delay means and the output of said NAND gate in said preprocessing circuit.

15. The output buffer of claim 12, wherein said pull-down control gate includes:

a first NOR gate having three input ports connected respectively to receive the output of said inverter in said preprocessing circuit, the input data, and said third feedback signal from said feedback/delay means; and a second NOR gate having three input ports connected respectively to receive the output of said inverter in said preprocessing circuit, the input data, and said first feedback signal from said feedback/delay means.

16. The output buffer of claim 14, wherein said first pull-up device is an n-type MOS transistor having:

a gate connected to the output of said second NOR gate in said pull-up control gate;

a source connected to said first pull-down device; and a drain connected to said first voltage line.

17. The output buffer of claim 14, wherein said second pull-up device is an n-type MOS transistor having:

a gate connected to the output of said first NOR gate in said pull-up control gate;

a source connected to said second pull-down device; and a drain connected to said second voltage line.

18. The output buffer of claim 15, wherein said second pull-down device is an n-type MOS transistor having:

a gate connected to the output of said second NOR gate in said pull-down control gate;

a source connected to said first pull-up device; and a drain connected to said first grounding line.

19. The output buffer of claim 15, wherein said first pull-down device is an n-type MOS transistor having:

a gate connected to the output of said first NOR gate in said pull-down control gate;

a source connected to said second pull-up device; and a drain connected to said second grounding line.

* * * * *